US007663894B2

(12) United States Patent
Gotou et al.

(10) Patent No.: US 7,663,894 B2
(45) Date of Patent: Feb. 16, 2010

(54) MULTILAYER PRINTED WIRING BOARD

(75) Inventors: Shigetada Gotou, Tokyo (JP); Yoshihito Asao, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 214 days.

(21) Appl. No.: 11/401,486

(22) Filed: Apr. 11, 2006

(65) Prior Publication Data
US 2006/0237226 A1 Oct. 26, 2006

(30) Foreign Application Priority Data
Apr. 15, 2005 (JP) ............................ 2005-118287

(51) Int. Cl.
*H05K 1/14* (2006.01)
(52) U.S. Cl. ....................... 361/794; 361/792
(58) Field of Classification Search .......... 361/792–795
See application file for complete search history.

(56) References Cited

U.S. PATENT DOCUMENTS 6,782,243 B2 * 8/2004 Shiotsu et al. .............. 455/117
6,797,889 B1 * 9/2004 Delaporte .................... 174/260
7,030,502 B2 * 4/2006 Chang ......................... 257/778
2003/0223208 A1 * 12/2003 Wu et al. .................... 361/794
2004/0118602 A1 * 6/2004 Lee et al. .................... 174/260

FOREIGN PATENT DOCUMENTS

JP 2002-374048 A 12/2002

* cited by examiner

*Primary Examiner*—Jinhee J Lee
*Assistant Examiner*—Yuriy Semenenko
(74) *Attorney, Agent, or Firm*—Sughrue Mion, PLLC

(57) ABSTRACT

Provided is a multilayer printed wiring board in which power supply patterns are shortened to decrease an impedance and electromagnetic radiation noise. The multilayer printed wiring board includes: a power supply layer (1) having at least two power supply patterns (5) with different voltages formed thereon; and a conductor layer (2) overlaid on the power supply layer (1) via an insulator, and at least one of the power supply patterns (5) has a first pattern portion (10) and a second pattern portion (11) formed in a non-contact manner with each other, and the first pattern portion (10) and the second pattern portion (11) are electrically connected to each other via a relay portion (14) including a relay pattern (12) formed on the conductor layer (2) and through holes (13) for connecting the power supply layer (1) and the conductor layer (2) at both ends of the relay pattern (12).

10 Claims, 5 Drawing Sheets

MULTILAYER PRINTED WIRING BOARD

BACKGROUND OF THE INVENTION

1. Field of the Invention

The present invention relates to a multilayer printed wiring board provided with a power supply layer having a plurality of power supply patterns with different power supply voltages.

2. Description of the Related Art

A conventional multilayer printed wiring board generally has a structure including at least one signal layer, at least one power supply layer, and at least one ground layer. Since power supply voltage used in a power supply layer in electronic equipment having a conventional digital circuit is mainly 5 V, a single 5 V power supply pattern is formed in the power supply layer in many cases.

In a conventional printed circuit board, a connector to which power is supplied is arranged in proximity to an LSI (large scale integration) the power consumption of which is highest on the board. Further, a power supply pattern formed from the power supply connector to an area where the LSI with the highest power consumption is mounted is made the thickest, and power supply patterns to ICs (integrated circuits) including other LSIs are made thinner according to the amount of electric current. This makes the power supply voltage supplied to the LSI with the highest power consumption and the power supply voltage supplied to an LSI which transmits and receives a signal to and from the LSI with the highest power consumption substantially equal on the circuit board (see, for example, JP 2002-374048 A).

However, since voltages supplied to and power consumptions of ICs are required to be reduced in recent years, 5 V power supply voltage and 3.3 V power supply voltage or lower are supplied to ICs in many cases.

As a result, the power supply layer is not formed of a single 5 V power supply pattern. For example, two power supply patterns of 5 V and 3.3 V or more than two power supply patterns insulated from each other are formed on the power supply layer.

In the conventional multilayer printed wiring board, since a plurality of power supply patterns with different power supply voltages exist on one power supply layer, when, for example, a 3.3 V power supply pattern for supplying power to a 3.3 V power supply pin of an IC is formed after a 5 V power supply pattern for supplying power to a 5 V power supply pin of the IC is formed, it is necessary to detour the already formed 5 V power supply pattern. Therefore, there is a problem in that the 3.3 V power supply pattern is lengthened, the impedance is increased, and thus, electromagnetic radiation noise radiated from the power supply pattern is increased.

SUMMARY OF THE INVENTION

The present invention has been made to solve the above problem. It is therefore an object of the present invention to provide a multilayer printed wiring board capable of decreasing the impedance and electromagnetic radiation noise by shortening power supply patterns.

A multilayer printed wiring board according to the present invention comprises: a power supply layer having at least two power supply patterns with different power supply voltages formed thereon; and a conductor layer overlaid on the power supply layer via an insulator. In the multilayer printed wiring board, at least one of the power supply patterns has a first pattern portion and a second pattern portion formed in a non-contact manner with each other, and the first pattern portion and the second pattern portion are electrically connected to each other via a relay portion comprising a relay pattern formed on the conductor layer and through holes for connecting the power supply layer and the conductor layer at both ends of the relay pattern.

According to the multilayer printed wiring board of the present invention, two power supply patterns with the same power supply voltage are formed on the power supply layer in a non-contact manner with each other, and the two power supply patterns are electrically connected to each other via a relay portion including the relay pattern formed on a conductor layer which is not the power supply layer having the two power supply patterns formed thereon and through holes for connecting the power supply layer and the conductor layer at both ends of the relay pattern. Therefore, the power supply patterns can be shortened, the impedance can be decreased, and thus, electromagnetic radiation noise can be decreased.

DETAILED DESCRIPTION OF THE PREFERRED EMBODIMENTS

Figure 1A:
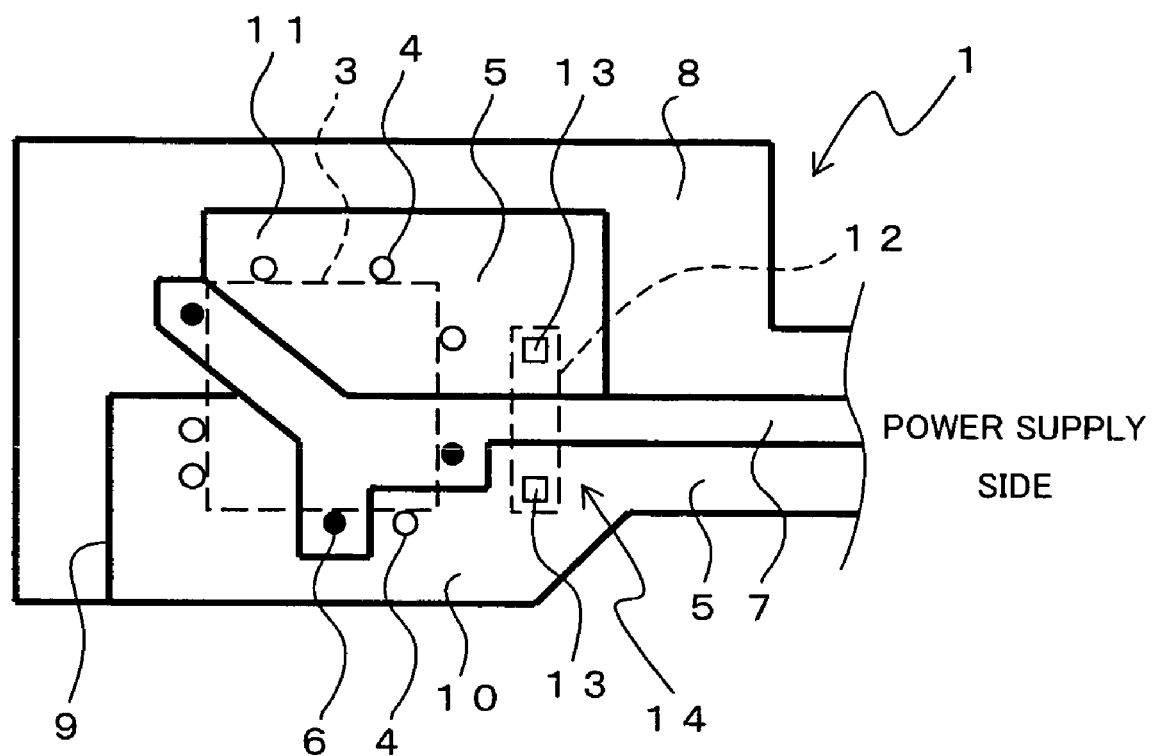
FIG. 1A is a plan view illustrating a power supply layer of a multilayer printed wiring board according to Embodiment 1 of the present invention.

Embodiments of the present invention are now described with reference to the accompanying drawings, in which the same or corresponding members or portions are denoted by the same reference numerals.

Embodiment 1

Figure 1B:
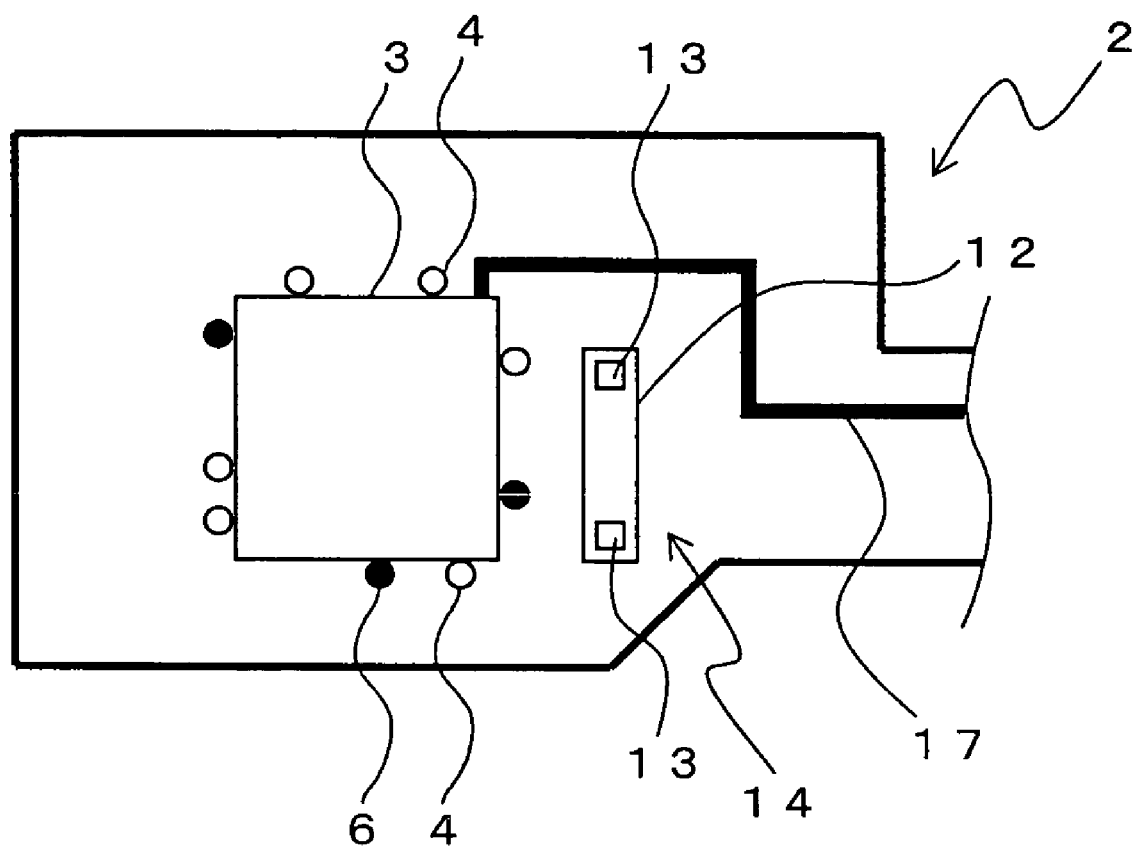
FIG. 1B is a plan view illustrating a signal layer (conductor layer) of the multilayer printed wiring board according to Embodiment 1 of the present invention.

FIG. 1A is a plan view illustrating a power supply layer 1 of a multilayer printed wiring board according to Embodiment 1 of the present invention, and FIG. 1B is a plan view illustrating a signal layer 2 (conductor layer) of the multilayer printed wiring board according to Embodiment 1 of the present invention. It is to be noted that the actual power supply layer 1 and signal layer 2 are provided with other members and portions than those described below but illustration and description thereof are omitted.

In FIGS. 1A and 1B, a 5 V power supply pattern 5 for supplying power to 5 V power supply pins 4 (white circles in the figures) of an IC 3 mounted on the signal layer 2, a 3.3 V power supply pattern 7 for supplying power to 3.3 V power supply pins 6 (black circles in the figures) of the IC 3, and, for example, a 1.2-V power supply pattern 8 serving as another power supply voltage for supplying power to a member which is not shown are formed in the power supply layer 1. The power supply patterns 5, 7, and 8 are insulated from each other via boundary portions 9. Power is supplied to each of the 5 V power supply pattern 5, the 3.3 V power supply pattern 7, and the 1.2-V power supply pattern 8 from connectors or the like which are not shown.

The boundary portions 9 are filled with adhesive for adhering an overlaying insulator to the power supply layer 1.

Here, the 5 V power supply pattern 5 has a first pattern portion 10 and a second pattern portion 11 which are formed in a non-contact manner with each other.

A relay pattern 12 made of the same material as that of the first and second pattern portions 10 and 11 and a signal pattern 17 for transmitting a signal from the IC 3 are formed in the signal layer 2. Through holes 13 for connecting the power supply layer 1 and the signal layer 2 are formed at both ends of the relay pattern 12. The relay pattern 12 and the through holes 13 form a relay portion 14.

The first and second pattern portions 10 and 11 are electrically connected to each other via the relay portion 14.

The relay portion 14 is formed between the first and second pattern portions 10 and 11 so as to perpendicularly and linearly straddle the 3.3 V power supply pattern 7 in a shortest distance.

The 5 V power supply pins 4 and the 3.3 V power supply pins 6 of the IC 3 are electrically connected via the through holes to the 5 V power supply pattern 5 and the 3.3 V power supply pattern 7, respectively.

An operation of the multilayer printed wiring board structured as above is now described hereinafter.

The 5 V power supply voltage supplied to the first pattern portion 10 is also supplied to the second pattern portion 11 connected thereto via the relay portion 14. Power is supplied to the 5 V power supply pins 4 from the first and second pattern portions 10 and 11.

Power is supplied to the 3.3 V power supply pins 6 from the 3.3 V power supply pattern 7.

In the multilayer printed wiring board according to Embodiment 1 of the present invention, since the relay portion 14 electrically connects the first and second pattern portions 10 and 11 to each other in the shortest distance so as to straddle the 3.3 V power supply pattern 7, the power supply pattern can be shortened, the impedance can be decreased, and thus, voltage drop can be decreased and electromagnetic radiation noise can be decreased.

Embodiment 2

Figure 2:
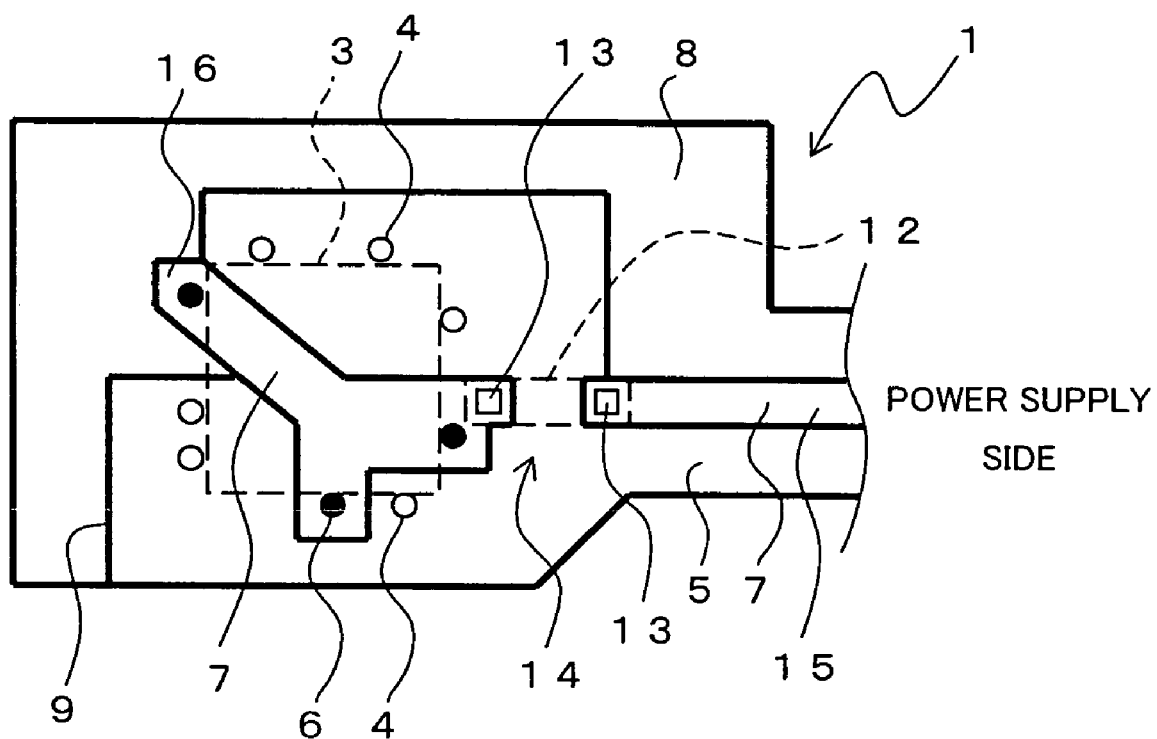
FIG. 2 is a plan view illustrating a power supply layer of a multilayer printed wiring board according to Embodiment 2 of the present invention.

FIG. 2 is a plan view illustrating a power supply layer 1 of a multilayer printed wiring board according to Embodiment 2 of the present invention.

In FIG. 2, a 5 V power supply pattern 5, a 3.3 V power supply pattern 7, and a 1.2-V power supply pattern 8 are formed on the power supply layer 1 so as to be insulated from each other via boundary portions 9.

Here, the 3.3 V power supply pattern 7 has a first pattern portion 15 and a second pattern portion 16 which are formed in a non-contact manner with each other.

A relay pattern 12 made of the same material as that of the first and second pattern portions 15 and 16 is formed in a signal layer 2. Except for this, the structure is the same as that of Embodiment 1, and thus, description thereof is omitted.

An operation of the multilayer printed wiring board structured as above is now described hereinafter.

The 3.3 V power supply voltage supplied to the first pattern portion 15 is also supplied to the second pattern portion 16 connected thereto via the relay portion 14. Power is supplied to the 3.3 V power supply pins 6 from the first and second pattern portions 15 and 16.

Power is supplied to the 5 V power supply pins 4 from the 5 V power supply pattern 5.

Since, generally, the higher the voltage is, the more the amount of generated noise becomes, it is not preferable to lengthen the 5 V power supply pattern 5 in which the power supply voltage is high. If, therefore, the design places priority to the 5 V power supply pattern 5, the 3.3 V power supply pattern 7 needs to detour the 5 V power supply pattern 5.

When the 3.3 V power supply pattern 7 detours the 5 V power supply pattern 5, the 3.3 V power supply pattern 7 is lengthened, the impedance is increased, and thus, noise is increased, which is required to be prevented.

In the multilayer printed wiring board according to Embodiment 2 of the present invention, since the first and second pattern portions 15 and 16 in which the power supply voltage is as low as 3.3 V are connected to each other via the relay pattern 12, the power supply pattern can be shortened, the amount of generated noise can be decreased, and thus, the influence of noise can be further decreased.

Embodiment 3

While, in Embodiment 2 described in the above, attention is focused on the power supply voltages of the respective power supply patterns, here, another embodiment is described where attention is focused on pattern widths which are lengths in a direction perpendicular to the direction of flow of electric current through the respective power supply patterns.

Generally, when a power supply pattern has a portion where the pattern width is small, according to the difference in the pattern widths at a connecting point of the portion where the pattern width is small and other portions, the impedance at the connecting point is increased, and thus, large noise is generated at the connecting point.

This embodiment has been made to solve the problem described in the above.

Figure 3:
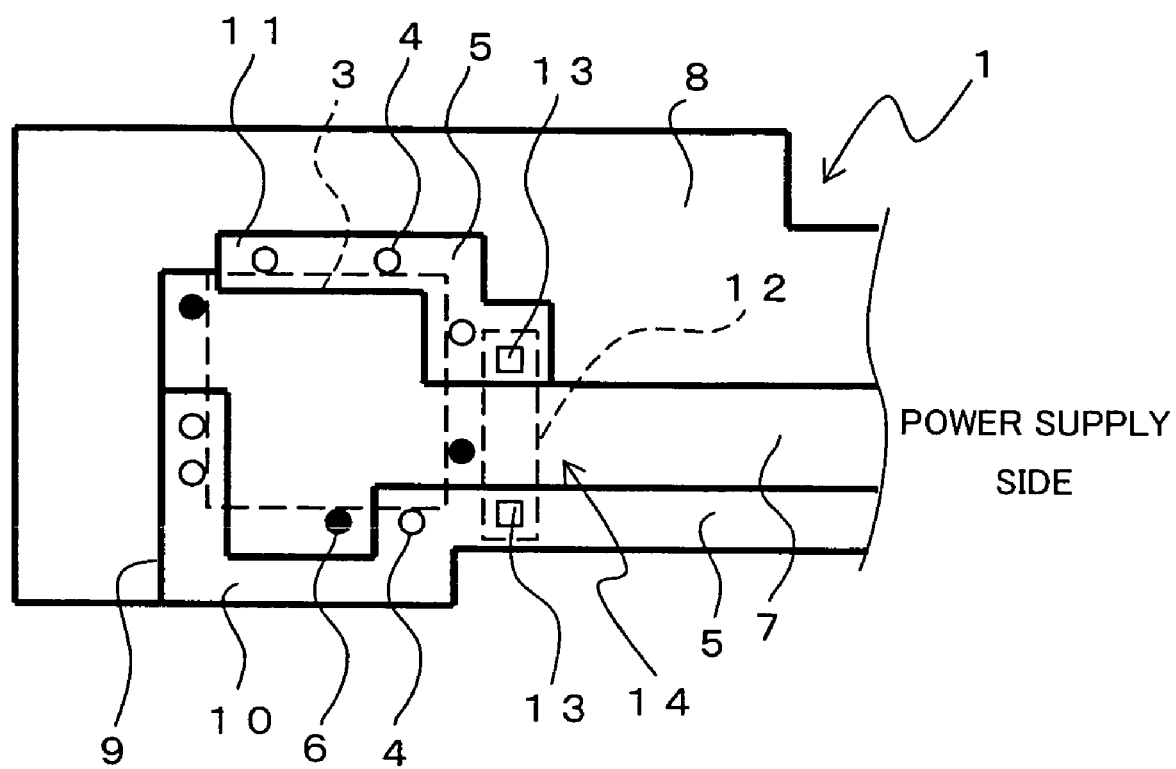
FIG. 3 is a plan view illustrating a power supply layer of a multilayer printed wiring board according to Embodiment 3 of the present invention.
Figure 4:
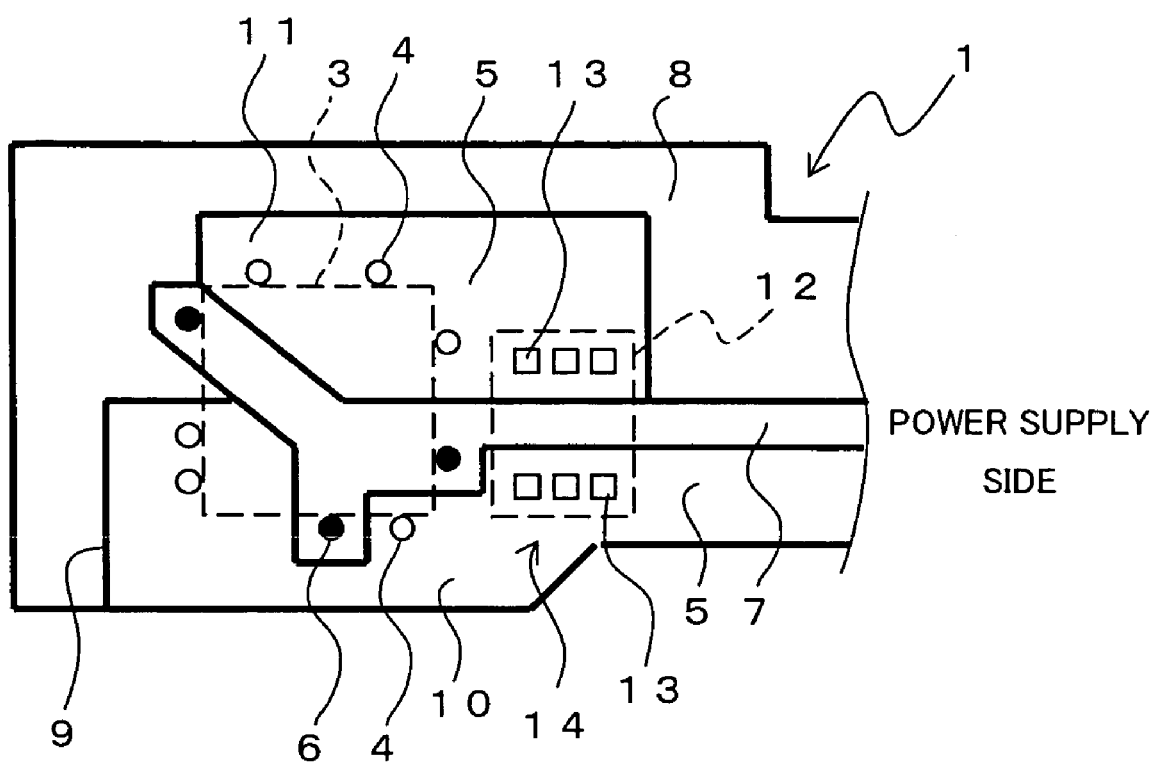
FIG. 4 is another plan view illustrating a power supply layer of the multilayer printed wiring board according to Embodiment 3 of the present invention.

FIG. 3 is a plan view illustrating a power supply layer 1 of a multilayer printed wiring board according to Embodiment 3 of the present invention. FIG. 4 is another plan view illustrating a power supply layer 1 of the multilayer printed wiring board according to Embodiment 3 of the present invention.

In FIG. 3, a 5 V power supply pattern 5 is formed such that its pattern width is smaller than that of a 3.3 V power supply pattern 7. The 5 V power supply pattern 5 has a first pattern portion 10 and a second pattern portion 11. The pattern width of a relay pattern 12 is made large such that the difference in pattern width between the relay pattern 12 and the first pattern portion 10, and the difference in pattern width between the relay pattern 12 and the second pattern portion 11 are small. Except for this, the structure is the same as that of Embodiment 1, and thus, description thereof is omitted.

In FIG. 4, the 5 V power supply pattern 5 has the first pattern portion 10 and the second pattern portion 11. The relay pattern 12 is formed such that the width thereof becomes larger as electric current increases due to the increase in the pattern widths of the first and second pattern portions 10 and 11. Since the pattern width of the relay pattern 12 is increased, the number of through holes 13 is increased accordingly. Except for these, the structure is the same as that of Embodiment 1, and thus, description thereof is omitted.

In the multilayer printed wiring boards according to Embodiment 3 of the present invention structured as described above, since the impedance at the connecting point is decreased, the amount of generated noise can be decreased, and thus, the influence of noise can be further decreased.

It is to be noted that, although, in the above Embodiments 1 to 3, the conductor layer is described as the signal layer 2, the structure of the present invention is of course not limited thereto, and the conductor layer may be a ground layer or a power supply layer other than the power supply layer 1 having the 5 V power supply pattern 5 and the 3.3 V power supply pattern 7 formed thereon. In such cases, effects similar to those of the above Embodiments 1 to 3 can also be obtained.

Further, in the description of the above Embodiments 1 to 3, either the 5 V power supply pattern 5 or the 3.3 V power supply pattern 7 has two pattern portions, only one relay portion 14 is formed, and the two pattern portions are connected to each other via the relay portion 14. However, the relationship between the pattern portions and the relay portion is not limited thereto, and three or more pattern portions and two or more relay portions may be formed and all the pattern portions may be connected to each other via the plurality of the relay portions. In such a case, effects similar to those of the above Embodiments 1 to 3 can also be obtained.

Still further, in the description of the above Embodiments 1 to 3, the relay portion 14 is formed only in the single signal layer 2. However, the structure of the present invention is of course not limited thereto, and relay portions may be provided in two or more conductor layers and one power supply pattern may be connected to relay portions formed in a plurality of layers. In such a case, effects similar to those of the above Embodiments 1 to 3 can also be obtained.

Further, though, in the description of the above Embodiments 1 to 3, the relay portion 14 and the two pattern portions are connected to each other in one-to-one correspondence, the structure of the present invention is of course not limited thereto, and relay portions of the same type may be provided in two or more conductor layers and connections with the two pattern portions may branch off to the plurality of relay portions, respectively.

In such a case, since the surface area of the power supply patterns can be increased without detouring and lengthening the power supply patterns, the impedance can be further decreased, the amount of generated noise can be further decreased, and thus, the influence of noise can be decreased.

What is claimed is:

1. A multilayer printed wiring board comprising:
    a power supply layer having at least two power supply patterns with different power supply voltages formed therein; and
    a conductor layer overlaid on the power supply layer via an insulator, wherein:
    at least one of the power supply patterns consists of a first pattern portion and a second pattern portion formed in a non-contact manner with each other, and
    the first pattern portion and the second pattern portion are electrically connected to each other via a relay portion comprising a relay pattern formed in the conductor layer and through holes which connect the power supply layer and the conductor layer at both ends of the relay pattern.

2. The multilayer printed wiring board according to claim 1, wherein the relay portion is formed such that the first pattern portion and the second pattern portion are connected to each other in a shortest distance.

3. The multilayer printed wiring board according to claim 1, wherein the relay pattern is formed such that a pattern width which is a length in a direction perpendicular to the direction of flow of electric current is increased as the pattern widths of the first pattern portion and the second pattern portion increase.

4. The multilayer printed wiring board according to claim 1, wherein the conductor layer comprises at least two conductor layers and the relay portion is formed on a plurality of the conductor layers, respectively.

5. The multilayer printed wiring board according to claim 1, wherein:
    the power supply patterns comprise a first power supply pattern connected to the relay portion and a second power supply pattern not connected to the relay portion; and
    the power supply voltage of the first power supply pattern is lower than the power supply voltage of the second power supply pattern.

6. The multilayer printed wiring board according to claim 1, wherein the conductor layer comprises a signal layer comprising a signal pattern formed thereon.

7. The multilayer printed wiring board according to claim 1, wherein another power supply pattern of the at least two power supply patterns is disposed between the first pattern portion and the second pattern portion with respect to a plan view of the power supply layer.

8. The multilayer printed wiring board according to claim 7, wherein, with respect to the plan view of the power supply layer, the relay portion straddles the another power supply pattern to connect the first pattern portion and the second pattern portion.

9. The multilayer printed wiring board according to claim 1, wherein the first pattern portion and the second pattern portion are formed on an opposite side of the insulator from the relay pattern.

10. The multilayer printed wiring board according to claim 1, wherein one of the ends of the relay pattern arranged in the conductor layer connects to the first pattern portion arranged in the power supply layer view one of said through holes, and another of the ends of the relay pattern connects to the second pattern portion arranged in the power supply layer via another of said through holes.

* * * * *